United States Patent [19]

Reed et al.

[11] Patent Number: 4,654,956
[45] Date of Patent: Apr. 7, 1987

[54] DRILL APPARATUS FOR USE WITH COMPUTER CONTROLLED PLOTTER

[75] Inventors: Ronald G. Reed; Michael Gustafson, both of Colorado Springs, Colo.

[73] Assignee: ProtoCAD, Inc., Colorado Springs, Colo.

[21] Appl. No.: 725,415

[22] Filed: Apr. 16, 1985

[51] Int. Cl.[4] .................... B23Q 3/157; B23B 47/22; B23B 47/08

[52] U.S. Cl. .................... 29/568; 33/1 M; 33/503; 33/666; 285/101; 408/3; 408/124; 408/130; 408/237

[58] Field of Search .................... 33/1 M, 189, 503; 408/3, 14, 124, 129, 130, 236, 237; 285/101, 102, 306; 29/568

[56] References Cited

U.S. PATENT DOCUMENTS

| | | | |
|---|---|---|---|
| 3,052,150 | 9/1962 | Jonker | 33/1 M |
| 3,158,883 | 12/1964 | Barr | 408/130 |
| 3,291,442 | 12/1966 | Cranage | 285/101 X |
| 3,377,028 | 4/1968 | Bruggeman | 285/101 X |
| 3,421,226 | 1/1969 | Lauzon | 33/1 M X |
| 3,663,114 | 5/1972 | Welsh et al. | 408/3 |
| 3,757,423 | 9/1973 | Wieg | 33/189 X |
| 4,077,736 | 3/1978 | Hutchens | 279/1 A X |

FOREIGN PATENT DOCUMENTS

| | | | |
|---|---|---|---|
| 977605 | 4/1951 | France | 408/124 |
| 594262 | 5/1959 | Italy | 408/124 |

Primary Examiner—Gil Weidenfeld
Assistant Examiner—Steven C. Bishop
Attorney, Agent, or Firm—John R. Ley

[57] ABSTRACT

Drilling apparatus is adapted for use with a computer controlled plotter to selectively use the plotter as an automatically positionable hole drilling device. A drill motor of the drilling apparatus is carried and manipulated by a carrier mechanism of the plotter in a manner similar to that in which a conventional plotter instrument is manipulated. A coupling apparatus is attached to the carrier mechanism for the purpose of selectively mechanically connecting to and establishing a pneumatic seal for supplying pressurized gas to operate the drill motor. An alignment apparatus is connected between the carrier mechanism and the drilling apparatus to position an axis through the drill bit of the drill motor orthogonal to the plotter table. An actuator apparatus moves the drill motor toward the plotter table to drill holes in the material positioned on the plotter table.

42 Claims, 7 Drawing Figures

Fig_1

Fig_2

Fig_3

Fig_4

Fig_5

4,654,956

DRILL APPARATUS FOR USE WITH COMPUTER CONTROLLED PLOTTER

This invention is related to another invention for a Process for Use in Rapidly Producing Printed Circuit Boards Using a Computer Controlled Plotter, Ser. No. 725,817, filed concurrently herewith, assigned to the assignee hereof, and incorporated herein by this reference. This invention for a Process for Use in Rapidly Producing Printed Circuit Boards involves using a conventional computer and computer controlled plotter to mark resist material on a conductor clad board and to drill holes in the printed circuit board by use of drill apparatus carried by the plotter. The present invention specifically relates to drill apparatus adapted for use with a computer controlled plotter to drill holes in a printed circuit board or other material which is carried and positioned by the plotter.

BACKGROUND OF THE INVENTION

The typical computer controlled plotter utilizes a carrier mechanism which selectively picks up and manipulates a pen or other conventional plotter instrument. The carrier mechanism moves the instrument transversely across a plotter table upon which the paper or other material to be marked is moved longitudinally. In this manner, X and Y control in the transverse and longitudinal dimensions of the drawing plane is achieved. The carrier mechanism operatively moves the marking point of the pen on and off of the paper or other material to control the extent to which marking occurs. The working point is raised and lowered from the surface by a slight pivoting movement of the carrier mechanism. This slight pivoting movement causes the marking tip of the pen to follow a slightly curved path which is not orthogonal to the plane of the paper or other material upon which the marking occurs.

To drill round holes in the circuit board or other material, it is necessary to axially move the drill bit orthogonal into and out of the printed circuit board. Round holes, as opposed to oval-like holes, are generally preferred in most situations. The slight pivoting movement of the carrier mechanism would cause the drill bit to move in an arc and cause the hole to become slightly oval, if the drill bit were moved up and down in an arc-like manner by the pivoting movement of the carrier mechanism. The pivoting movement of the carrier mechanism would also cause the drill bit to experience increased resistance and wear from lateral side loading as it moves up and down, and might result in drill bit breakage.

The usual procedure for drilling holes of different diameters is to interchange different sized drill bits in the drill motor. This conventional approach is unsatisfactory in making the computer controlled plotter serve as an automatically controlled device capable of drilling holes of different diameters because of the difficulty involved and the size of the automatic equipment involved in changing small drill bits in a very small drill motor.

Another constraint inherent in using a plotter as an automatic hole drilling device is that the drill motor must have a shape and configuration essentially the same as a conventional plotter instrument, such as a pen, in order for the carrier mechanism to retain and manipulate it, and in order for the drill motor to be transferred to and from the carrier mechanism automatically. Another limitation is that the operative drilling force must be coupled to the drill motor from the carrier mechanism in order that the carrier mechanism be unobstructed for automatically transferring the drill motor to and from it. Thus, the means for coupling the operative force to the drill motor must not restrict the normal movement and manipulation capability of the carrier mechanism.

These factors, among others, are important limitations, constraints and background information for the present invention. In applications other than the production of printed circuit boards, but where a computer controlled plotter is used as a device for automatically drilling holes in material carried by the plotter, these considerations are just as relevant.

SUMMARY OF THE INVENTION

One objective of the present invention is to provide a new and improved drill apparatus adapted for use with a computer controlled plotter. Another objective is to provide a new and improved drill apparatus which has the capability to automatically transfer a drill motor to and from a carrier mechanism of the plotter in the same manner as other conventional plotter instruments are transferred, and which has the capability to apply operative force to the drill motor from an operating mechanism attached to the carrier mechanism. Another objective of the present invention is to teach a new and improved technique for, in essence, selectively adding the capability to a computer controlled plotter of using it as an automatically controllable drilling apparatus. Still another objective is to provide a new and improved drill apparatus which selectively establishes a mechanical connection and a pneumatic seal to a device such as a drill motor which utilizes pressurized fluid or gas as operative energy.

In accordance with one of its principal aspects, the drill apparatus of the present invention includes a drill motor having a significant external portion thereof which is essentially of the same configuration as a pen or other instrument normally manipulated by a computer controlled plotter. An exterior jacket of the drill motor includes means for locating the drill motor on the carrier mechanism of the plotter in a predetermined position. The axis through a drill bit of the drill motor is thereby located in a predetermined relationship to an axis of any other type of conventional instrument such as a pen carried by the plotter. The exterior configuration of the drill motor also allows it to be transferred to and from the carrier mechanism in essentially the same manner as other conventional instruments are transferred to and from the carrier mechanism. The drill motor preferably operates from pressurized gas such as air. A turbine converts the energy of the pressurized gas into rotary motion for rotating the drill bit. An interior housing supports the turbine and other interior elements of the drill motor. The housing is movably supported with respect to the jacket to allow the drill bit to move toward and away from the plotter table.

In accordance with another one of its principal aspects, the drill apparatus of the present invention comprises a coupling apparatus which selectively establishes a mechanical connection and a pneumatic seal to a fitting of the drill motor. Pressurized air is supplied through the coupling apparatus to the drill motor. The coupling apparatus includes a housing within which a slider member is movably positioned. The slider member includes a passageway through which pressurized air is supplied to the drill motor. Sealing means is connected to the slider member and operatively surrounds the passageway and an opening in the fitting at the interface between the fitting and the slider member. Upon the application of pressurized gas to an interior chamber within the housing of the coupling apparatus, the slider member is forced downward into contact with the fitting of the drill motor. The amount of downward force created by the pressure on the slider member is greater than the force on the sealing means from the pressurized gas in the passageway and in the opening at the interface between the fitting and slider member. A pneumatic seal is thereby assured because the force creating the seal is greater than that force caused by the pressurized gas acting on the sealing means. A mechanical connection to the fitting of the drill motor is also established which operatively assists in retaining the drill motor in the predetermined operative position. The application of the pressurized gas to the interior chamber of the housing of the coupling apparatus thereby selectively establishes the mechanical connection and pneumatic seal to the drill motor, as well as delivering a supply of pressurized gas for operating the drill motor without leaks occurring in the flow path at the interface between the slider member and the fitting.

In accordance with another one of its principal aspects, the drill apparatus of the present invention includes an actuator apparatus adapted to be connected to the carrier mechanism of the plotter. The actuator apparatus includes an axial actuator cylinder connected to the housing of the coupling apparatus. The actuator cylinder is adapted to move the housing of the coupling apparatus and the housing of the drill motor along the axis through the drill bit and toward the plotter table of the plotter. In lhis manner the drill bit is advanced to force the drill bit through the material to be drilled.

In accordance with another one of its principal aspects, the drill apparatus of the present invention includes an alignment apparatus for operatively aligning the axis through the drill bit at a predetermined angle, preferably orthogonal to the plotter table. The alignment apparatus is preferably operative between a pivotable instrument-holding portion of the carrier mechanism and a slide portion of the carrier mechanism. The alignment apparatus pivots the instrument-holding portion a predetermined amount with respect to the slide portion to align the drill bit axis orthogonal to the plotter table. The drill motor, the coupling apparatus and the actuator apparatus are all operatively connected to the instrument-holding portion. The orthogonal alignment assures that the holes drilled are round and extend orthogonally into the material on the plotter table.

The nature and details of the drill apparatus of the present invention are more completely understood by reference to the following description of the preferred embodiment taken in conjunction with the drawings, and from the appended claims.

DESCRIPTION OF THE PREFERRED EMBODIMENT

Figure 1:
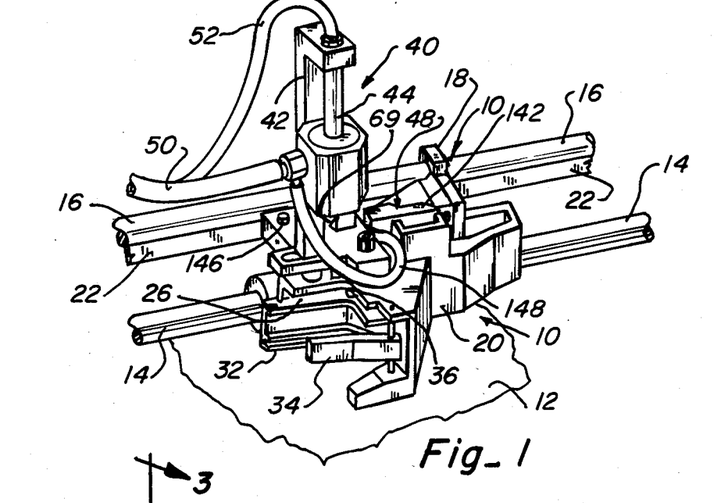
FIG. 1 is a perspective view of a drill motor operating mechanism, including actuator, coupling and alignment apparatus of the drill apparatus of the present invention attached to a carrier mechanism of a computer controlled plotter.
Figure 2:
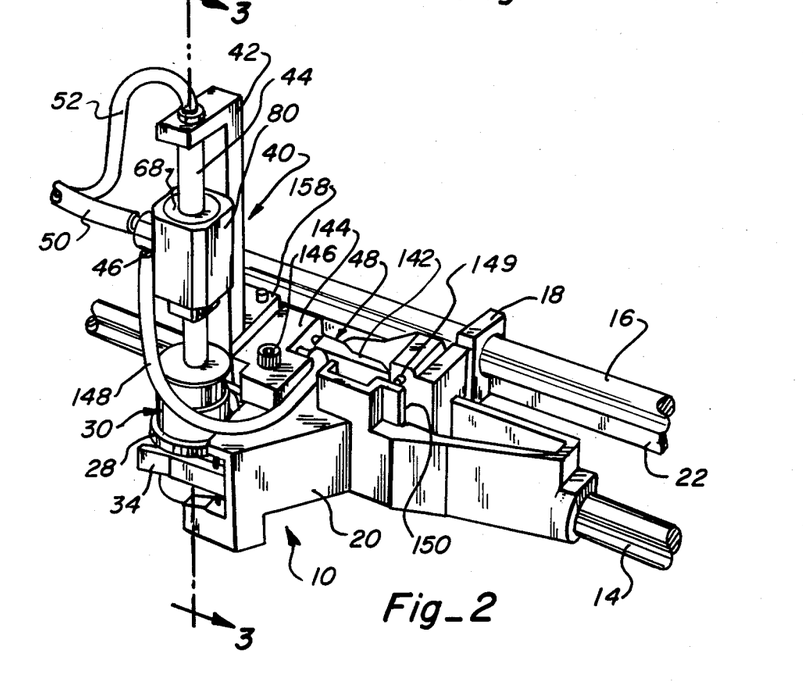
FIG. 2 is a perspective view from another viewing angle of the operating mechanism shown in FIG. 1 and including a drill motor operatively connected to the coupling apparatus.

A conventional carrier mechanism 10 of a conventional computer controlled plotter (not otherwise shown), with which the drill apparatus of the present invention is utilized, is illustrated in FIGS. 1 and 2. The carrier mechanism 10 moves transversely from side to side of a plotter table 12 on a pair of vertically spaced and transversely extending rods, 14 and 16. The carrier mechanism 10 principally comprises a slide portion 18 and an instrument-holding portion 20, which are pivotably connected together at a location adjacent the lower rod 14. The slide portion 18 maintains a consistent position in the plane perpendicular to the rods 14 and 16 as the carrier mechanism 10 moves along the rods. However, to force the writing point of a conventional pen downward onto the paper or other material on the plotter table 12, the instrument-holding portion 20, which holds the pen, is pivoted away from the upper rod 16 in the plane perpendicular to the rods 14 and 16. Pivoting is obtained by the slight pivoting movement of the upper rod 16 and a depending flap portion 22 thereof. The flap portion 22 makes operative contact with the instrument-holding portion 20 to normally hold it against the slide portion 18. Whenever the operative force on the upper rod 16 is relaxed, the weight of the instrument-holding portion 20 and any plotter instrument such as a pen held therein causes the pen to move downward with its marking point contacting the paper. A conventional servo (not shown) of the plotter rotates the upper rod 16 and the flap 22. The slide portion 18 of the carrier mechanism 10 has sufficient clearance to avoid contact with the flap portion 22 as the flat portion pivots. A drive belt (not shown) or the like is connected to the slide portion 18 for the purpose of moving the carrier mechanism 10 transversely along the rods 14 and 16. The drive belt is connected to a conventional stepper motor (not shown) of the plotter in order to precisely control the degree of transverse movement of the carrier mechanism.

The instrument-holding portion 20 of the carrier mechanism 10 includes a receiving groove 26 adapted to receive an annular positioning shoulder 28 on the exterior of an instrument such as a drill motor 30 shown in FIG. 2. A lower support ridge 32 also contacts the exterior of the instrument retained to the instrument-holding portion 20. A spring biased pivotable retaining lever 34 contacts the exterior of the instrument on the opposite side of the support ridge 32. The retaining lever 34 acts as retaining means which holds the instrument received in the instrument-holding portion 20 in a predetermined location established by the receiving groove 26 and the circular curvature 36 of the instrument-holding portion 20 adjacent the receiving groove 26.

All of the instruments including the drill motor 30 which are retained in the carrier assembly 10 have an exterior portion which is essentially of the same configuration and diameter and which is concentric about an operative axis of the particular instrument. Accordingly, all of these instruments are positioned with their operative axes in the same relative position when retained in the instrument-holding portion of the carrier mechanism. A typical computer controlled plotter includes a carousel (not shown) which carries up to six different instruments. Under the control of the computer, the carousel is indexed or rotated and the carrier mechanism is moved to a position adjoining the carousel for the purpose of automatically transferring a selected one of the instruments from the carousel onto the instrument-holding portion of the carrier mechanism. After the instrument so transferred has been used, the carrier mechanism is moved back to the carousel and the instrument is automatically transferred from the carrier mechanism back to the carousel. Different types of instruments, for example, pens having different marking widths, can thereby be automatically utilized to create different effects.

These described features of the computer controlled plotters are conventional, as exemplified by the Hewlett-Packard Model 7475A plotter, which has proved satisfactory for use with the present invention.

One of the important features of the present invention is that the drill motor 30 can be carried by the carousel and transferred to and from the carrier mechanism in essentially the same manner as the conventional plotter instruments. Thus, by utilizing different diameter drill bits 38 (FIG. 3) with each drill motor 30, different diameter holes can be drilled in the material positioned on the plotter table 12 by interchanging different drill motors. Another important feature of the present invention is that the operating mechanism for the drill motor 30 does not interfere with the normal operation of the plotter when conventional instruments are employed. The importance of these features may be better appreciated by reference to the aforementioned invention for a Process for Use in Rapidly Producing Printed Circuit Boards.

Figure 3:
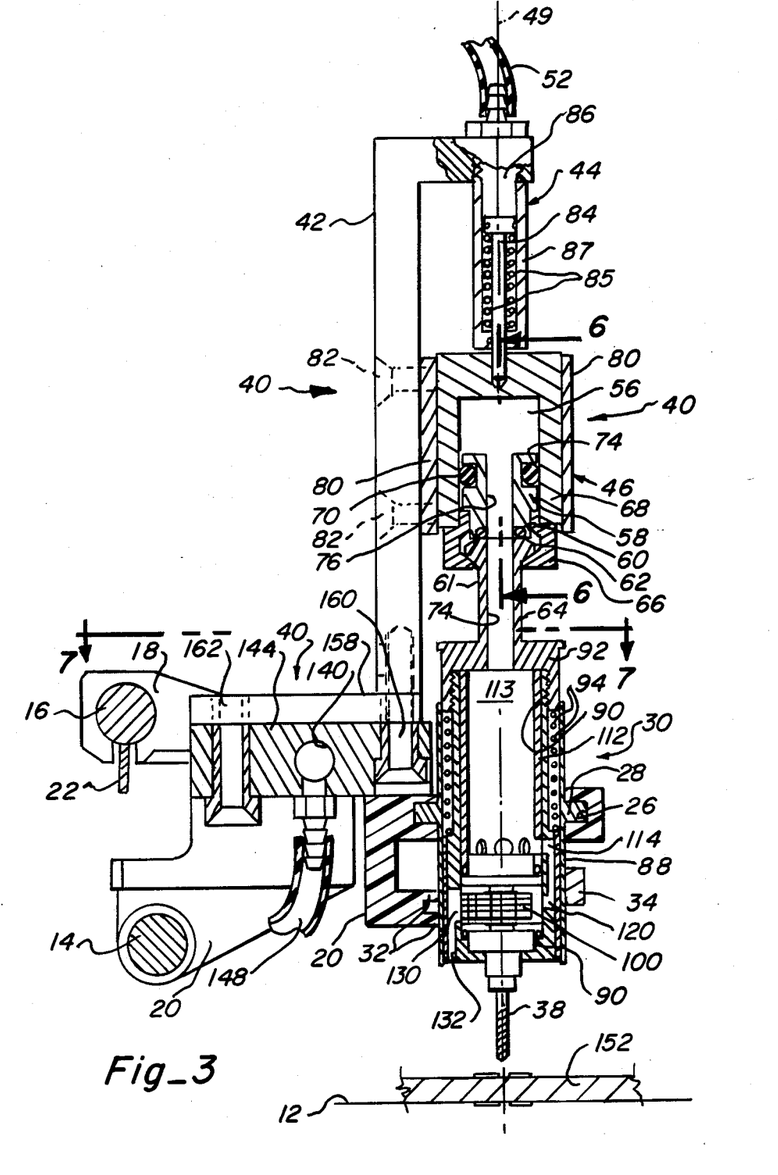
FIG. 3 is a section view of the subject matter shown in FIG. 2, taken substantially in the plane of line 3—3 through the operating mechanism and in the plane of line 4—4 through the drill motor as shown in FIG. 5, with some of the details of the carrier mechanism removed for clarity.

The drill apparatus of the present invention comprises the drill motor 30 and a drill motor operating mechanism 40 as shown in FIGS. 1, 2 and 3. The operating mechanism 40 includes a tower 42, which is attached to the instrument-holding portion 20 of the carrier mechanism 10, an axial actuating means or apparatus in the form of a pneumatic cylinder 44 attached to the tower 42, and a mechanical and pneumatic coupling means or apparatus 46 attached to the tower 42 and the cylinder 44. The coupling apparatus 46 operatively connects to and supplies pressurized air or gas to the pneumatically actuated drill motor 30. The operating mechanism 40 also includes an alignment means or apparatus 48 which is operative between the slide portion 18 and the instrument-holding portion 20 of the carrier assembly for the purpose of aligning the axis 49 (FIG. 3) of the drill bit 38 at a predetermined angle, preferably orthogonal, to the plotter table 12 (FIG. 1).

Hoses 50 and 52 supply pressurized air or gas to the operating mechanism 40. The pressurized air from hose 50 is operative to cause the coupling apparatus 46 to firmly mechanically contact and grip the upper end of the drill motor 30 and hold it in a rigid position and to supply the pressurized air to the pneumatically operated drill motor 30 for the purpose of rotating a drill bit 38. The pressurized air from the hose 50 also operates the orthogonal alignment apparatus 48 to pivot the instrument-holding portion 20 of the carrier mechanism forward from the slide portion 18 to a predetermined angle whereby the operative axis 49 through the drill bit 38 is orthogonal to the plotter table 12. Pressurized air from the hose 52 is supplied to the cylinder 44. The cylinder 44 extends under the influence of pressurized air and forces portions of the coupling apparatus 46 and the connected drill motor 30 downward along the axis 49 of the drill bit toward the plotter table 12 in order to advance the rotating drill bit into the material on the plotter table and thus bore a hole in the material. The coupling apparatus 46 is also positioned on the tower 42 to rigidly locate the upper retained end of the drill motor 30 at a predetermined location to fix the axis 49 of the drill bit 38 coaxially with the operative axis of any other instrument when it is retained in the carrier mechanism. Thus the axis 49 through the drill bit is located at the same relative position on the carrier mechanism as the operative axis of any other plotter instrument. In this manner, the drill bit 38 can be positioned to drill holes in precise locations in the material on the plotter table.

Figures 6, 7:
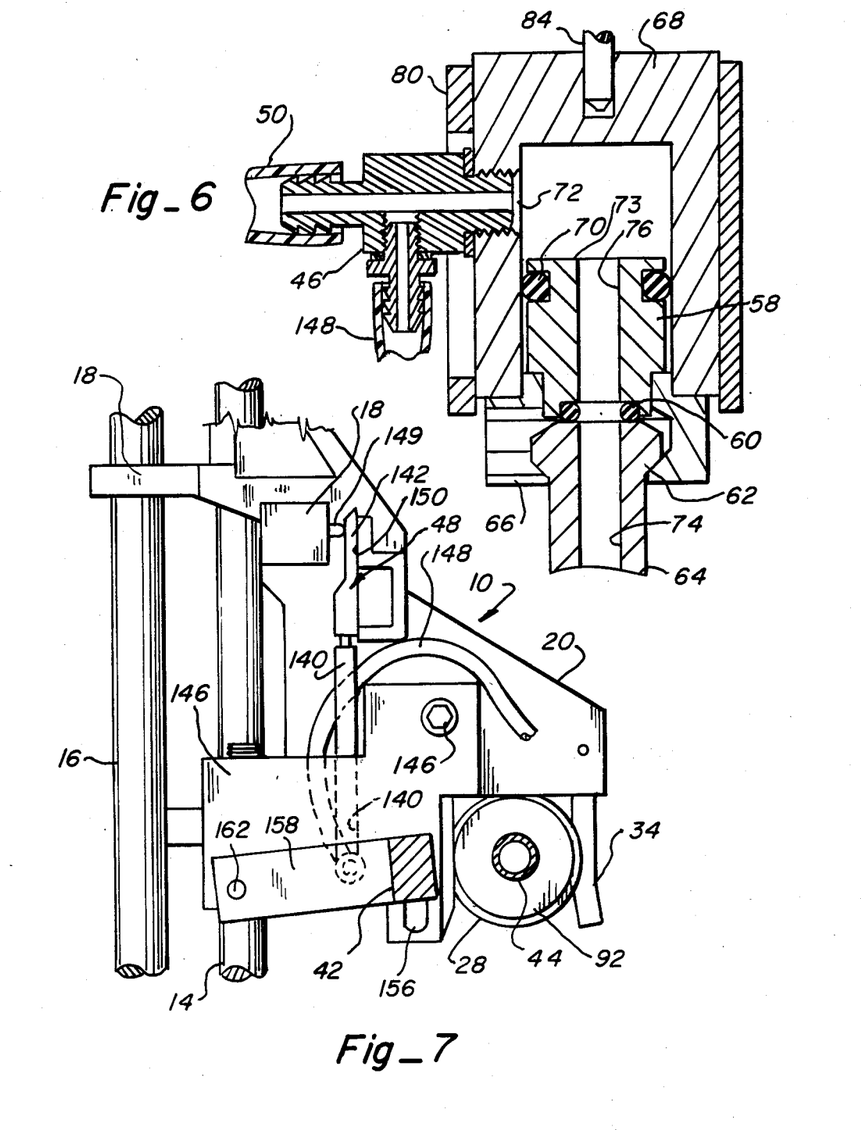
FIG. 6 is an enlarged section view of the coupling apparatus and an upper portion of a fitting of the drill motor shown in FIG. 3, taken substantially in the plane of line 6—6 in FIG. 3.
FIG. 7 is a top plan view of FIG. 3 taken substantially in the plane of line 7—7.

The selective mechanical and pneumatic sealing connections of the coupling apparatus 46 to the drill motor 30 are achieved simultaneously. Upon the application of air pressure to an interior chamber 56 of the coupling apparatus 46, an internal annular pod spool or slider member 58 moves downward and presses an internal annular resilient sealing ring 60 into contact with the top surface of an annular connection lip 62 of an upper fitting 64 of the drill motor 10, as shown in FIGS. 3 and 6. The sealing ring 60 is attached to the lower end surface of the slider member 58 and thus moves with the slider member. Contacting and supporting means in the form of a hanger member or seal finger 66 is rigidly connected to a housing 68. The housing 68 defines the interior chamber 56 which is closed at the upper end. The seal finger 66 extends below the housing 68. The seal finger 66 also has a front access opening 69 (FIG. 1) that allows the connection lip 62 and fitting 64 to pass therethrough when the drill motor is transferred to and from the instrument-holding portion of the carrier mechanism.

A larger annular resilient seal ring 70 is carried by the slider member 58. The seal ring 70 creates an air pressure seal between the slider member 58 and the interior wall of the housing 68. Air pressure is applied to the interior chamber 56 through an inlet opening 72 formed in the housing 68. The interior chamber 56 is closed at its lower end by the slider member 58 which is in sealing moveable engagement with the housing 68.

Upon pressurization of the interior chamber 56, the pressure acts on the upper or force-applying surface 73 of the slider member 58 and forces the slider member downward. The sealing ring 60 contacts the upper surface of the connection lip 62 and surrounds an axially disposed opening 74 in the fitting 64. The resilient sealing ring 60 deforms slightly and creates a surrounding pneumatic seal around a passageway 76 through the slider member 58 and the opening 74 through the upper fitting 64. The large seal ring 70 moves or rolls down with the slider member 58 and maintains an airtight seal with the interior surface of the housing 68. The passageway 76 extends through the slider member 58 between its upper and lower ends.

An airtight seal between the sealing ring 60 and the top surface of the upper fitting 64 is assured because the force effectively applied from the force-applying surface 73 of the slider member 58 is greater than that force resulting from the air pressure within the interior of the sealing ring 60 at the interface between the slider member 58 and the fitting 64. The effective surface area of the force-appplying surface 73 of the slider member 58 is considerably greater than the contact surface area of the sealing ring 60 with the top surface of the connection lip 64. Thus the contact pressure of the sealing ring 60 against lip 64 is greater than the air pressure within the interior of the sealing ring 60. A pneumatic sealing condition is thus established. This sealing condition assures that the pressurized air is transferred from the interior chamber 56 through the passageway 76 and into the opening 74 in the upper fitting 64 without any significant loss of energy due to pressure leaks.

When the interior chamber 56 is not pressurized, the resiliency of the larger seal ring 70 tends to roll it slightly back up the interior surface of the housing 68. This slight upward rolling movement carries the slider member 58 upward. The mechanical connection between the slider member and the connection lip 62 of the upper fitting 64 is thereby loosened sufficiently so that the drill motor 30 can be transferred out of the coupling apparatus 46.

Thus, when the interior chamber 56 is selectively pressurized, a pneumatic sealing and mechanical connection is achieved between the coupling apparatus 46 and the drill motor 30, and the drill motor is supplied with pressurized air through the opening 74. Upon release of the pressure air in the chamber 56, the pneumatic sealing and the mechanical connections are broken or discontinued. The selective making and breaking of the pneumatic sealing and mechanical connections are particularly important in the application of the present invention to a carrier mechanism of a plotter. Space must be conserved because the carrier mechanism is relatively small, and the space in which the carrier mechanism moves is limited. Bulky and complicated operating mechanisms would interfere with the normal operation of the carrier mechanism and create unnecessary complications in the mechanical and operational aspects of adapting a drill assembly to the carrier mechanism of a computer-controlled plotter.

The housing 68 is received within a guide 80. The operative connection of the housing 68 within the guide 80 allows the housing 68 to move in a path parallel to the axis 49 within the guide 80. Fasteners 82 rigidly connect the guide 80 to the tower 42.

Axial movement of the coupling housing 68 of the coupling apparatus 46 along the axis 49 is caused as a result of extending the air cylinder 44. The air cylinder 44 is of conventional type which has a ram 84 that moves axially downward when a chamber 86 is pressurized. A return spring 85 moves the ram 84 axially upward when the air pressure is released from the chamber 86. The lower end of the ram 84 is connected to the housing 68. The upper end of a housing 87 of the air cylinder 44 is rigidly attached to the tower 42. Upon axial downward movement of the ram 84, the coupling housing 68 is pushed downward. The drill motor 30, which is connected to the coupling housing 68, is also forced downward in unison with the downward-moving coupling housing 68. The drill bit 38 of the drill motor 30 is thus advanced into the material to be drilled.

An outer shell or jacket 88 of the drill motor 30 includes the annular positioning shoulder 28. The annular shoulder 28 fits within the receiving groove 26 of the instrument-holding portion 20 of the carrier mechanism to locate the axis 49 at a predetermined position on the carrier mechanism. The support ridge 32 and the retaining lever 34 also rest against the lower outside surface of the jacket 88. The elements of the drill motor 30 interiorly of the jacket 88 are free to move axially with respect to the jacket 88. Thus, upon downward movement of the drill motor created by the actuating force from the cylinder 44, the interior elements of the drill motor move downward with respect to the stationarily positioned jacket 88. In this manner, the drill bit 38 is advanced into the material on the plotter table 12. The coaxial locations of the axis 49 through the slider member 58, the air cylinder 44 and the drill bit prevent tipping or nonlinear movement of the drill bit as the drill bit moves downward.

Figures 4, 5:
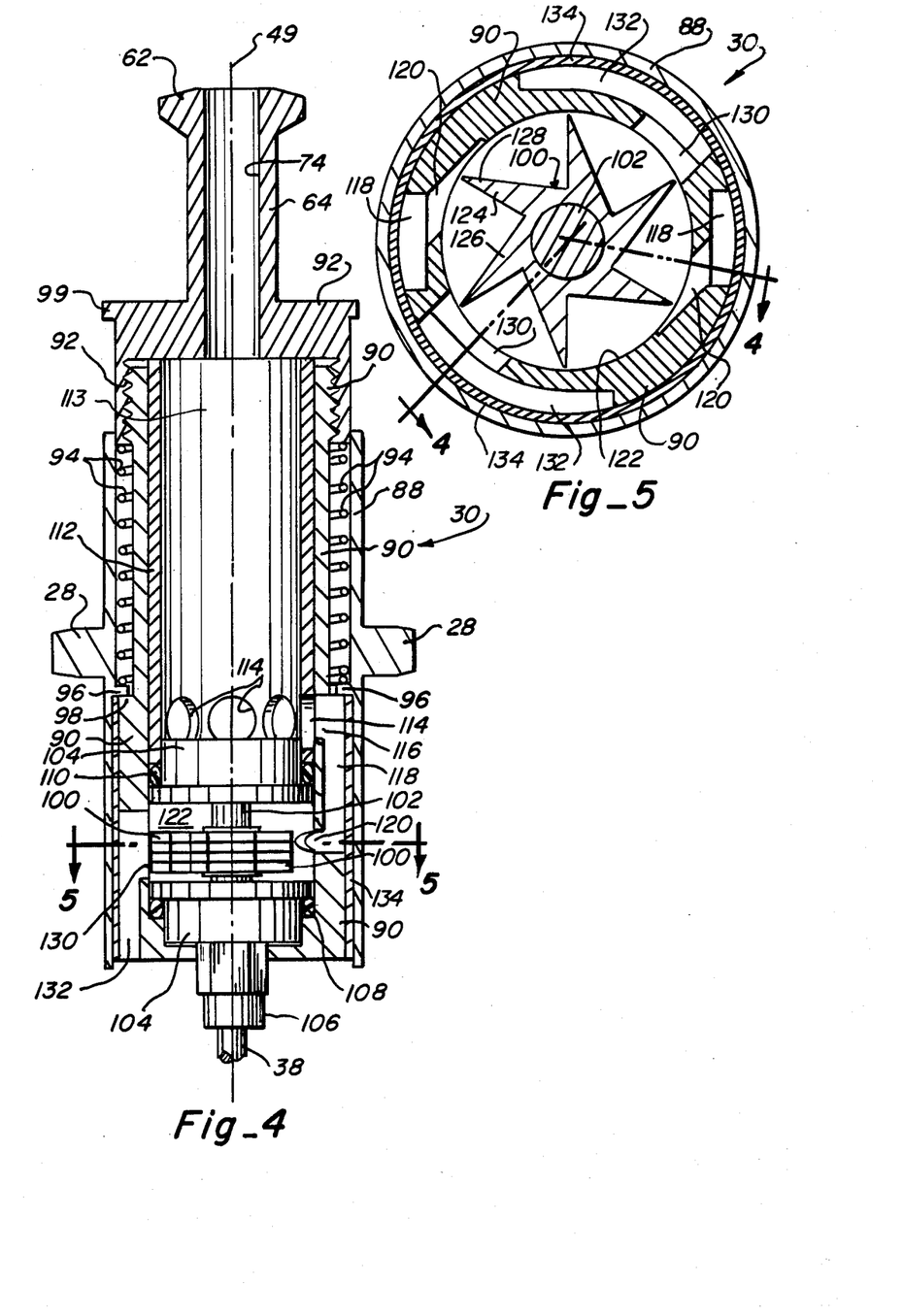
FIG. 4 is an enlarged view of the drill motor shown in FIG. 3, the section view of the drill motor shown in FIGS. 3 and 4 being in the plane of line 4—4 as shown in FIG. 5.
FIG. 5 is a section view through the drill motor shown in FIG. 4 taken substantially in the plane of line 5—5.

Details of the drill motor 30 are illustrated in FIGS. 4 and 5. The internal elements of the drill motor 30, the upper fitting 64 and the drill bit 38 are all operatively connected to or positioned with respect to a main turbine housing member 90. The outer jacket 88 surrounds much of the main turbine housing member 90, and the main turbine housing 90 moves axially with respect to the jacket 88. A cap portion 92 of the upper fitting 64 is threaded to the upper end of the turbine housing 90. A compression spring 94 is positioned between an internal flange 96 of the jacket 88 and the lower edge of the cap portion 92. The spring 94 continually pushes upward on the cap portion 92 of the upper fitting 64 and thereby continually tends to lift the turbine housing 90 and its attached elements axially upward with respect to the jacket 88. An annular shoulder 98 of the turbine housing 90 contacts the flange 96 to limit the maximum amount of upward movement. When the drill motor 30 is axially moved downward by the drill motor operating mechanism 40 (FIG. 3), the spring 94 compresses to allow the turbine housing 90 and its attached elements to move downward with respect to the stationarily positioned jacket 88. The maximum amount of downward movement at the turbine housing 90 is established when a flange ring 99 on the cap portion 92 contacts the upper edge of the jacket 88. This maximum downward movement is predetermined to prevent the drilling into the plotter table. After the hole is drilled, the springs 85 and 94 cooperatively lift the turbine housing 90 and its attached elements, the housing 68 of the coupling apparatus 46, and the ram 84 of the cylinder 44. In this manner the actuator apparatus 44 is readied for advancing the drill bit 38 to bore the next hole.

The elements of the drill motor 30 contained within the interior of the turbine housing 90 are inserted therein from the top of the turbine housing 90 prior to connection of the upper fitting 64. An assembly including a turbine rotor 100, a turbine shaft 102, a pair of bearings 104 which have been press-fitted on each side of the turbine shaft 102, and the drill bit 38 connected by a collar 106 to the shaft 102, are next inserted from the top of the open turbine housing 90. A resilient sealing ring 108 has previously been placed in position on the lower bearing 104. An upper sealing ring 110 surrounds the upper bearing 104. Next, a tubular sleeve 112 having a plurality of air distribution ports 114 is inserted downward through the open interior of the turbine housing 10. The lower end of the sleeve 112 presses down against the upper sealing ring 110 when the upper fitting 64 is threaded onto the turbine housing 90. The spring 94 is inserted between the turbine housing 90 and the jacket 88 before the upper fitting 64 is attached.

The pressurized air supply for the drill motor 30 is directed through the opening 74 in the upper fitting 64 into the open hollow interior 113 within the sleeve 112. Near the lower end of the sleeve 112 at a location slightly above the upper extremity of the upper bearing 104, the plurality of air distribution ports 114 are formed through the sleeve 112. At least one or more of the air distribution ports 114 aligns with an inlet 116. By employing a plurality of circumferentially spaced air distribution ports 114, the sleeve 112 does not have to be aligned in any particular manner when inserted within the interior of the turbine housing 90. A supply duct 118 conducts the pressurized air from the inlet 116 to a tangential injection port 120 which is formed in the turbine housing 90. As is shown in FIG. 5, the injection port 120 extends substantially tangentially into a cylindrical rotor chamber 122 within which the rotor 100 rotates. Pressurized air from the tangential injection port 120 contacts a radially extending surface 124 of each blade 126 of the turbine rotor 100, as is shown in FIG. 5. The tangential injection of the pressurized air causes maximum torque on the turbine rotor 100. As the turbine rotor 100 rotates, the air confined between the rearward facing radial surface 124 and a forward facing surface 128 of the following blade 126 is opened to an exhaust port 130. The exhaust port 130 is formed in the turbine housing 90. An exhaust duct 132 connects with the exhaust port 130 and extends axially downward to the lower end of the turbine housing 90. The exhausted air exiting the rotor chamber 122 is thereby directed downward through the exhaust duct 132 at a location adjacent the drill bit 28. This exhausted air helps loosen and remove drill particles created by drilling so that they may be blown or moved away from the plotter.

The turbine supply duct 118 and the exhaust duct 132 extend axially along the exterior surface of the turbine housing 90. In order to confine the air flow through both ducts 118 and 132, an exterior cover sleeve 134 is expansion fitted in a firm engaging relationship around the lower portion of the housing 90.

Pressurized air flows through the drill motor 30 in the following series flow path: the opening 74 in the upper fitting 64, the open interior 113, the air distribution ports 114, the inlets 116, the turbine supply ducts 118, the tangential injection ports 120, the space between the rearward facing radial surface 124 of each blade 126 of the rotor 100 and the forward facing surface 128 of the next following blade 126, the exhaust ports 130, the exhaust ducts 132, and downward adjacent to the drill bit and onto the surface of the material being drilled.

The pneumatically driven rotor 100 rotates at extremely high rates from relatively low supplied air pressures to achieve effective drilling. Furthermore, the amount of space utilized by the rotor 100 is relatively small, thereby allowing it to be incorporated within the relatively small structure of the drill motor 30. The size of the drill motor 30 can therefore be limited to approximately the same size as a conventional instrument such as a pen used in a computer controlled plotter.

The alignment apparatus 48 includes an air cylinder 140 which is operatively connected to a wedge-shaped element 142, as is shown in FIG. 7. The air cylinder 140 is connected to an alignment plate 144, and the alignment plate 144 is connected by screw fasteners 146 to the instrument-holding portion 20 of the carrier mechanism 10. Air is supplied to the cylinder 140 through a hose 148. The hose 148 is connected with the hose 50 (FIGS. 1 and 2). When the hose 148 is pressurized, the air cylinder 140 acts as means to insert the wedge-shaped element 142 between a pin 149 on the slide portion 18 and a flat surface 150 of the instrument-holding portion 20. The instrument-holding portion 20 of the carrier mechanism 10 is thereby pivoted away from the slide portion 18 of the carrier mechanism 10. The thickness of the wedge-shaped element 142 creates the desired degree of pivoting in a plane perpendicular to the rods 14 and 16 (FIG. 1) to position the axis 49 (FIG. 3) orthogonal to the plotter table 12. The fixed position of the tower 42 to the plate 144 permanently locates the axis 49 perpendicularly to the plotter table in a plane parallel to the rods 14 and 16 (FIG. 1). Upon release of the air pressure in hoses 50 and 148, the air cylinder 140 retracts the wedge-shaped element 142. The instrument-holding portion 20 is thereby free to pivot in accordance with the forces applied by the flap 22 of the rod 16, in the conventional manner.

The operating sequence for the drill apparatus commences by the delivery of pressurized air through the hose 50 (FIGS. 1 and 2). The air cylinder 140 of the alignment apparatus 48 extends the wedge 142 to pivot the drill motor 30 and its operating mechanism 40 to align the axis therethrough orthogonal with the plotter table. Simultaneously, the coupling apparatus 46 pneumatically seals and mechanically connects to the upper fitting 64 of the drill motor 30. The turbine rotor of the drill motor immediately commences rotation. Thereafter, under the selective application of pressurized air in hose 52, the actuator apparatus cylinder 44 forces the moveable elements of the coupling apparatus 46 and the attached drill motor 30 axially downward toward the plotter table. The rotating drill bit 38 bores a hole in the object or material such as a printed circuit board 152 (FIG. 3) laying on the plotter table. After boring the hole, the air pressure in the hose 52 is released and the springs 85 and 94 (FIG. 4) return the internal moveable elements of the drill motor 30 and the connected coupling apparatus 46 upward. In this manner, selective axial actuation is possible without de-energizing the drill motor.

When it is desired to release the mechanical and pneumatic connection of the drill motor 30 from the coupling apparatus 46, the air pressure in hose 50 is released. The seal ring 70 (FIG. 3) in the coupling apparatus 46 relaxes and rolls slightly upward. The slider member 58 is carried upward, thereby releasing the mechanical connection of the slider member 58, connection lip 62 and seal finger 66. With this released mechanical contact, the drill motor 30 can be transferred from the carrier mechanism 10 in the usual manner.

The ability to transfer different drill motors 30 to and from the carrier mechanism is important. Each of a plurality of drill motors will have an attached drill bit of a different diameter. By transferring the different drill motors with the different diameter drill bits, different sized holes can be automatically drilled. Furthermore, because the drill motor is of approximately the same configuration as a conventional pen used with the computer controlled plotter, a plurality of drill motors with different sized drill bits can be positioned in and carried by the conventional carousel of the plotter. Under the automatic control of the computer controlling the plotter, the carousel is accessed to transfer the different drill motors, one at a time, to and from the carrier assembly for drilling the different sized holes.

By arranging the operating mechanism 40 in the described manner, it does not interfere with the normal operation of the plotter when a conventional pen or optical sight is in use. The pen will not contact the coupling apparatus 44 and is carried by the instrument-holding portion 20 of the carrier mechanism in the normal manner. Pens can also be transferred to and from the carrier mechanism and the carousel in the normal manner. The same is also true for optical sights. However, to use an optical sight, it is necessary to optically sight down an optical and operative axis through the sight. Since the optical axis of the sight will be positioned coaxially with the axis 49 of coupling apparatus 46 and cylinder 44 (FIG. 3), it is necessary to pivot the tower 42 and its attached actuator coupling appartus out of alignment with the optical axis the optical sight. To allow the tower 42 to be move this manner, a pivoting slot 156 (FIG. 7) is formed in alignment plate 144. As is shown in FIG. 3, the tower 42 is connected to a pivot plate 158 by a screw fastener 160. The pivot plate 158 pivots about another fastener 162. By manually loosening one of the fasteners 146 which is accessible from the upper side (FIG. 7) of the alignment plate 144, the plate 158 can sufficiently pivot about fastener 162, and the fastener 160 moves through the pivot slot 156. Since tower 42 and all of its connected elements are moved out of alignment with the axis of the optical sight, the optical sight is free for unobstructed use in the normal manner.

The numerous advantages, improvements and details of the drill apparatus have been described with a degree of specificity. It should be understood, that the specificity of the description has been made by way of preferred example and that the invention is defined by the scope of the appended claims.

What is claimed is:

1. Drill apparatus for use with a computer-controlled plotter for drilling holes in material resting on a plotter table of the plotter at selected positions established by operation of the plotter, the plotter including a movable carrier mechanism having retaining means for holding a conventional plotter instrument transferred to the carrier mechanism during use of the plotter, said drilling apparatus comprising:
    a drill motor having a drill bit operatively connected thereto; and
    means associated with the drill motor and cooperative with the retaining means of the carrier mechanism for allowing the drill motor to be transferred to and from the carrier mechanism and for locating the drill motor on the carrier mechanism with the drill bit extending toward the plotter table.

2. Drill apparatus as defined in claim 1 wherein said means for locating the drill motor operatively locates an axis through the drill bit of said motor in a predetermined position relative to a predetermined location of an operative axis of a conventional plotter instrument when held by the carrier mechanism.

3. Drill apparatus as defined in claim 2 wherein the predetermined position of the axis through the drill bit of said motor is substantially coincident with the predetermined location of the operative axis of a conventional instrument when positioned on the carrier mechanism.

4. Drill apparatus as in claim 3 wherein the locating means of said drill motor includes a portion which contacts the carrier mechanism to position the drill motor on the carrier mechanism in substantially the same manner and location that a conventional plotter instrument is positioned on the carrier mechanism and which is substantially of the same exterior configuration as a portion of a conventional instrument which is held in the carrier mechanism.

5. Drill apparatus as defined in claim 2 wherein said locating means is also operative to allow the drill bit to be moved toward and away from the plotter table while the drill motor is located on the carrier mechanism.

6. Drill apparatus as defined in claim 2 further comprising:
    coupling means operatively connected to the carrier mechanism and operative for coupling energy to the drill motor for rotating the drill bit.

7. Drill apparatus as defined in claim 6 further comprising:
    actuator means operatively connected between the carrier mechanism and the drill motor and operative for selectively moving the drill bit toward the plotter table.

8. Drill apparatus as defined in claim 7 further comprising:
    aligning means connected to the carrier mechanism and operative for selectively aligning the axis through the drill bit of said drill motor at a predetermined angle relative to the plotter table.

9. Drill apparatus as defined in claim 8 wherein the axis through the drill bit of said drill motor is orthogonal to the plotter table when said actuator means moves the drill bit toward the plotter table.

10. Drill apparatus as defined in claim 9 wherein:
    said actuator means is connected to the coupling means and is selectively operative to move the coupling means toward the plotter table, and
    said coupling means is further operative for establishing a mechanical connection to the drill motor to move the drill bit in conjunction with the coupling means upon movement of the coupling means by said actuator means.

11. Drill apparatus as defined in claim 8 wherein:
    the energy for rotating the drill bit is a supply of pressurized gas;
    said drill motor includes a turbine operatively connected for rotating the drill bit, the turbine operating from pressurized gas applied thereto; and
    said coupling means operatively connects to the drill motor to supply pressurized gas from the coupling means to the drill motor for operating the turbine.

12. Drill apparatus as defined in claim 11 wherein:
    the drill motor includes a fitting having an opening through which pressurized gas is supplied to the drill motor for operating the turbine;
    said coupling means further includes a passageway through which pressurized gas is supplied to the drill motor; and
    said coupling means further includes means for selectively mechanically connecting with the fitting of the drill motor and for creating a pneumatic seal between the coupling means and the fitting to confine the pressurized gas within the passageway of the coupling means and within the opening of the fitting.

13. Drill apparatus as defined in claim 12 wherein said coupling means operatively creates the mechanical connection and the pneumatic seal approximately simultaneously between the coupling means and the fitting of the drill motor.

14. Drill apparatus as defined in claim 13 wherein said coupling means further comprises:
- a housing defining an interior chamber;
- means for applying the pressurized gas to the interior chamber;
- a slider member operatively positioned within the interior chamber in sealing engagement with the housing and operative to move within the interior chamber upon the application of gas pressure to the interior chamber, the passageway extending through the slider member;
- sealing means surrounding the passageway at an end of the slider member and operative for contacting the fitting, the sealing means also surrounding the opening of the fitting when the slider member contacts the fitting to create the pneumatic seal;
- another end of the slider member including a force-applying surface facing into the interior chamber upon which the pressure of the gas within the interior chamber is operative to move the slider member, the force-applying surface having an effective area upon which the gas pressure is effective to create the force to move the slider member; and
- the effctive area of the force-applying surface being substantially greater than the area over which the sealing means contact the fitting.

15. Drill apparatus for use with a computer controller plotter drilling holes in material resting on a plotter table of the plotter at selected positions established by operation of the plotter, the plotter includng a movable carrier mechanism having retaining means for holding a conventional plotter instrument, said drilling apparatus comprising:
- a drill motor having a drill bit and a turbine operatively connected for rotating the drill bit, the turbine operating from pressurizd gas applied thereto;
- means associated with the drill motor and cooperative with the retaining means of the carrier mechanism for locating the drill motor on the carrier mechanism with the drill bit extending toward the plotter table and with an axis of the drill bit occupying a predetermined position;
- means connected to the carrier mechanism for conducting pressurized gas to the carrier mechanism;
- coupling means connected to the carrier mechanism and operative for connecting the drill motor to the supply of pressurized gas;
- actuator means operatively connected between the carrier mechanism and the drill motor and operative for selectively moving the drill bit toward the plotter table;
- aligning means connected to the carrier mechanism and operative for selectively aligning the axis through the drill bit at a predetermined angle relative to the plotter table;
- said drill motor including a fitting having an opening through which the pressurized gas is supplied to the turbine;
- said coupling means further includes a housing defining an interior chamber, means for applying the pressurized gas to the interior chamber, a slider member operatively positioned within the interior chamber to move within the interior chamber upon the application of gas pressure to the interior chamber, a passageway extending through the slider member,
- and supporting means extending from the housing and operative for contacting and supporting the fitting; and
- the connection of the coupling means to the drill motor is created by movement of the slider member toward the fitting while the fitting is restrained against movement in the opposite direction by the supporting means; and
- sealing means surrounding the passageway of the slider member and the opening of the fitting for creating a pneumatic seal when the coupling means and the drill motor achieve a connection.

16. Drill apparatus as defined in claim 15 wherein: the slider member moves within the housing in a direction parallel to the axis through the drill bit, and
- the supporting means positions the fitting to locate the axis of the drill bit orthogonal to the plotter table.

17. Drill apparatus as defined in claim 16 wherein said actuator means moves the coupling means in a direction parallel to the axis through the drill bit.

18. Drill apparatus as defined in claim 17 wherein the actuator means applies force to the housing of coupling means at a location substantially coincident with the axis through the drill bit.

19. Drill apparatus as defined in claim 16 wherein:
- the fitting includes an annular connection lip on the upper end of the fitting, and
- the supporting means comprises at least one finger member extending from the housing member and operative for supporting the annular connection lip of the fitting from a location on the connection lip opposite of that location which the slider member contacts.

20. Drill apparatus as defined in claim 19 wherein the finger member includes an access opening through which the connection lip passes upon transfering the drill motor to and from the carrier mechanism.

21. Drill apparatus for use with a computer controlled plotter for drilling holes in material resting on a plotter table of the plotter at selected positions located by the plotter, the plotter including a movable carrier mechanism having retaining means for holding a conventional plotter instrument, the carrier mechanism including an instrument-holding portion pivotably connected to a slide portion, the plotter conventionally including means for pivoting the instrument-holding portion relative to the slide portion to contact a marking point of a conventional pen with material on the plotter table, and said drill apparatus is operatively selectively connected to the instrument-holding portion and comprises:
- a drill motor having a drill bit operatively connected thereof;
- means associated with the drill motor and cooperative with the retaining means of the carrier mechanism for locating the drill motor on the instrument holding portion of the carrier mechanism with an axis through the drill bit of the drill motor in a predetermined position and with the drill bit extending toward the plotter table;
- coupling means connected to the carrier mechanism and operative for coupling energy to the drill motor for rotating the drill bit;

actuator means operatively connected between the carrier mechanism and the drill motor and operative for selectively moving the drill bit toward the plotter table;

aligning means connected to the carrier mechanism and operative for selectively aligning the axis through the drill bit of said drill motor at a predetermined angle relative to the plotter table, said aligning means including a wedge element and means connected to the wedge element and selectively operative for inserting the wedge element between the instrument-holding portion and the slide portion to pivot the instrument-holding portion a predetermined amount to align the axis through the drill bit at the predetermined angle relative to the plotter table.

22. Drill apparatus as defined in claim 21 wherein the wedge element is of a predetermined thickness to pivot the instrument-holding portion to a predetermined angle to align the axis of the drill bit orthogonal to the plotter table.

23. Drill apparatus as defined in claim 21 wherein said means for inserting the wedge element is operative in conjunction with said coupling means to insert the wedge element between the instrument-holding portion and the slide portion approximately simultaneously with the coupling of energy by said coupling means to the drill motor for rotating the drill bit.

24. Drill apparatus as defined in claim 23 wherein the energy for operation of the inserting means and for rotating the drill bit is pressurized gas.

25. Drill apparatus as defined in claim 10 further including return means for moving the drill bit and the coupling means away from the plotter table after the actuator means has moved the drill bit toward the plotter table.

26. Drill apparatus as defined in claim 15 wherein the fitting and the coupling means cooperatively comprise means operative to allow the selective transfer of the fitting to and from the coupling means.

27. Drill apparatus for use in a computer controlled plotter having a carrier mechanism with retaining means for holding conventional plotter instruments such as a pen above a plotter table, comprising:
a jacket;
a drill motor including a drill bit, the drill motor operatively positioned within the jacket for longitudinal movement relative to the jacket along an axis through the drill bit; and
locating means extending from the jacket and adapted for operatively engaging the retaining means of the carrier mechanism to position the jacket at a predetermined fixed location on the carrier mechanism and to allow the drill motor to move relative to the jacket along the drill bit axis toward the plotter table.

28. Drill apparatus as defined in claim 27 wherein the drill motor further comprises:
a turbine housing,
a turbine positioned within the turbine housing and operatively connected for rotating the drill bit upon the application of pressurized gas thereto, and
means associated with the turbine housing for conducting pressurized gas to the turbine for operating the turbine.

29. Drill apparatus as defined in claim 28 further comprising:

means associated with the turbine housing for exhausting air from the turbine substantially downward around the drill bit.

30. Drill apparatus as defined in claim 28 wherein:
the turbine includes a rotor connected to the drill bit, the rotor includes at least one blade;
the turbine housing defines a rotor chamber within which the rotor is operatively positioned for rotation; and
the turbine housing further defines an injection port through which pressurized gas is injected into the rotor chamber to contact each blade of the rotor.

31. Drill apparatus as defined in claim 30 wherein the injection port is oriented in the rotor chamber to direct pressurized gas substantially perpendicularly onto a surface of each blade of the rotor.

32. Drill apparatus as defined in claim 30 wherein the turbine housing further defines:
an exhaust port for conducting exhaust gas from the rotor chamber, and
an exhaust duct in communication with the exhaust port for directing the exhaust gas about the drill bit.

33. Drill apparatus as defined in claim 30 further comprising:
a fitting connected to the turbine housing and having an opening through which pressurized gas is admitted to the drill motor, and
the fitting includes connection means for supporting the turbine housing at a location opposite the drill bit.

34. Drill apparatus as defined in claim 33 further comprising:
coupling means for selectively mechanically connecting to the fitting and for supplying pressurized gas to the opening in the fitting.

35. Drill apparatus as defined in claim 34 wherein said coupling means further selectively creates a pneumatic seal around the opening in the fitting to avoid leaks of pressurized gas around the opening.

36. Drill apparatus as defined in claim 35 further comprising:
actuator means operatively connected to the coupling means for selectively moving the coupling means and the operatively connected turbine housing in one direction relative to the carrier mechanism.

37. Drill apparatus as defined in claim 36 further comprising:
biasing means operative between the jacket and the turbine housing for biasing the turbine housing in the opposite direction with respect to the direction which the actuator means moves the coupling means and the turbine housing.

38. Drill apparatus as defined in claim 36 wherein the plotter includes the plotter table, and further comprising:
aligning means operatively connected to the carrier mechanism for positioning the turbine housing and the drill bit for movement longitudinally along the axis which extends at a predetermined angle to the plane of the plotter table.

39. Drill apparatus as defined in claim 27 further comprising:
actuator means connected to the carrier mechanism and operative for contacting the drill motor to move the drill bit toward the plotter table.

40. Drill apparatus as defined in claim 39 further comprising:

coupling means connected to the carrier mechanism and operative for supplying energy to the drill motor for rotating the drill bit during longitudinal movement of the drill bit toward the plotter table.

41. Drill apparatus as defined in claim 40 wherein: said jacket includes means cooperating with the retaining means of the carrier mechanism for allowing the jacket and drill motor to be automatically transferred as an assembly to and from the carrier mechanism under the control of the plotter.

42. Drill apparatus for use with a computer controlled plotter for drilling holes in material resting on a plotter table of the plotter at selected positions established by operation of the plotter, the plotter including a movable carrier mechanism having retaining means for holding a conventional plotter instrument transferred to the carrier mechanism during use of the plotter and for allowing the automatic transfer of the conventional plotter instrument to and from the carrier mechanism during operation of the plotter, said drilling apparatus comprising:

a drill operatively connected thereto; and a housing within which the drill motor is positioned, the jacket having means to be received on the carrier mechanism and held by the retaining means, the jacket also including locating means for locating the axis of the drill bit substantially coincident with the predetermined location of an operative axis of a conventional instrument when retained on the carrier mechanism; and said locating means adapted to cooperate with the retaining means to allow the drill motor and jacket to be automatically transferred to and from the carrier mechanism under control of the plotter and in substantially the same manner as a conventional plotter instrument is transferred to and from the carrier mechanism under control of the plotter.

* * * * *